United States Patent
Lee et al.

(10) Patent No.: US 11,257,921 B2
(45) Date of Patent: Feb. 22, 2022

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Hsin-Yi Lee, Hsinchu (TW); Hsuan-Yu Tung, Keelung (TW); Chin-You Hsu, Hsinchu (TW); Cheng-Lung Hung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/388,200

(22) Filed: Apr. 18, 2019

(65) Prior Publication Data

US 2020/0335598 A1 Oct. 22, 2020

(51) Int. Cl.
*H01L 29/49* (2006.01)
*H01L 21/28* (2006.01)
*H01L 29/78* (2006.01)
*H01L 29/66* (2006.01)
*H01L 27/088* (2006.01)
(Continued)

(52) U.S. Cl.
CPC .... *H01L 29/4966* (2013.01); *H01L 21/28088* (2013.01); *H01L 21/28247* (2013.01); *H01L 21/82345* (2013.01); *H01L 21/823431* (2013.01); *H01L 21/823468* (2013.01); *H01L 27/0886* (2013.01); *H01L 29/0649* (2013.01); *H01L 29/66545* (2013.01); *H01L 29/66795* (2013.01); *H01L 29/785* (2013.01)

(58) Field of Classification Search
CPC .......... H01L 29/4966; H01L 21/28247; H01L 29/785; H01L 21/823431; H01L 29/66795; H01L 27/0886; H01L 29/0649; H01L 21/82345; H01L 21/28088; H01L 29/66545; H01L 21/823468; H01L 21/28079; H01L 29/0847; H01L 29/7855; H01L 29/42372; H01L 29/0646; H01L 29/41791
See application file for complete search history.

(56) References Cited

U.S. PATENT DOCUMENTS 3,729,634 A * 4/1973 Jensen ..................... G03H 1/00
250/204
3,826,213 A * 7/1974 Riebandt ................ B63H 25/04
114/144 C
(Continued)

FOREIGN PATENT DOCUMENTS

| TW | 201349310 A | 12/2013 |
| TW | 201403718 A | 1/2014 |
| TW | 201701360 A | 1/2017 |

*Primary Examiner* — Edward Chin
(74) *Attorney, Agent, or Firm* — Slater Matsil, LLP

(57) ABSTRACT

Semiconductor devices and methods of manufacturing semiconductor devices are provided. In embodiments a passivation process is utilized in order to reduce dangling bonds and defects within work function layers within a gate stack. The passivation process introduces a passivating element which will react with the dangling bonds to passivate the dangling bonds. Additionally, in some embodiments the passivating elements will trap other elements and reduce or prevent them from diffusing into other portions of the structure.

20 Claims, 6 Drawing Sheets

(51) Int. Cl.
*H01L 21/8234* (2006.01)
*H01L 29/06* (2006.01)

(56) References Cited

U.S. PATENT DOCUMENTS

| | | | |
|---|---|---|---|
| 3,887,106 A * | 6/1975 | Charlson | B65D 83/12 |
| | | | 221/197 |
| 8,487,378 B2 | 7/2013 | Goto et al. | |
| 8,586,436 B2 | 11/2013 | Ng et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 9,564,489 B2 | 2/2017 | Yeo et al. | |
| 10,304,835 B1 * | 5/2019 | Tsai | H01L 21/02318 |
| 2014/0282326 A1 * | 9/2014 | Chen | G06F 30/398 |
| | | | 716/111 |
| 2015/0132938 A1 * | 5/2015 | Ahmed | H01L 21/28176 |
| | | | 438/591 |
| 2017/0148686 A1 * | 5/2017 | Bao | H01L 21/823828 |
| 2017/0301544 A1 * | 10/2017 | Chi | H01L 29/785 |
| 2018/0175165 A1 * | 6/2018 | Lim | H01L 29/66545 |
| 2018/0261459 A1 * | 9/2018 | Tsai | C23C 16/06 |
| 2019/0096680 A1 * | 3/2019 | Wei | H01L 21/28185 |
| 2019/0189402 A1 * | 6/2019 | Yedave | H01J 37/32449 |
| 2020/0105602 A1 * | 4/2020 | Wu | H01L 21/823462 |
| 2020/0111892 A1 * | 4/2020 | Chan | H01L 21/28088 |

* cited by examiner

SEMICONDUCTOR DEVICE AND METHOD OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
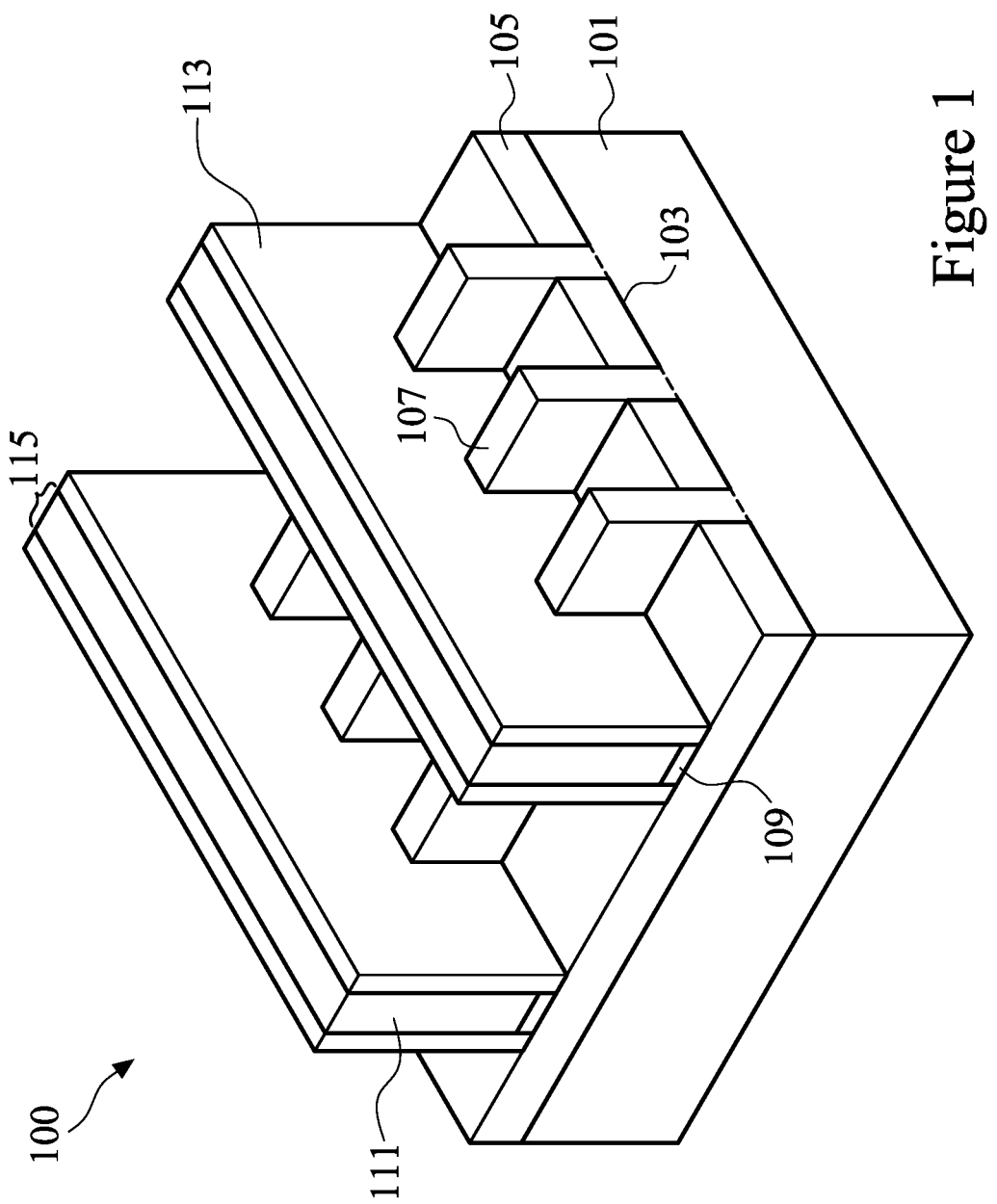
FIG. 1 illustrates a perspective view of a formation of semiconductor fins, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular examples including finFET devices with multiple threshold voltages for 5 nm or 3 nm technology nodes. However, embodiments are not limited to the examples provided herein, and the ideas may be implemented in a wide array of embodiments.

With reference now to FIG. 1, there is illustrated a perspective view of a semiconductor device 100 such as a finFET device. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

In other embodiments the substrate 101 may be chosen to be a material which will specifically boost the performance (e.g., boost the carrier mobility) of the devices formed from the substrate 101. For example, in some embodiments the material of the substrate 101 may be chosen to be a layer of epitaxially grown semiconductor material, such as epitaxially grown silicon germanium which helps to boost some of the measurements of performance of devices formed from the epitaxially grown silicon germanium. However, while the use of these materials may be able to boost some of the performance characteristics of the devices, the use of these same materials may affect other performance characteristics of the device. For example, the use of epitaxially grown silicon germanium may degrade (with respect to silicon) the interfacial and charge defects ($D_{it}$) of the device. Embodiments described herein can help to ameliorate the degradation of the interfacial and charge defects ($D_{it}$).

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Furthermore, the fins 107 may be patterned by any suitable method. For example, the fins 107 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 107.

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive or non-conductive material and may be selected from a group comprising polysilicon, W, Al, Cu, AlCu, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Figure 2:
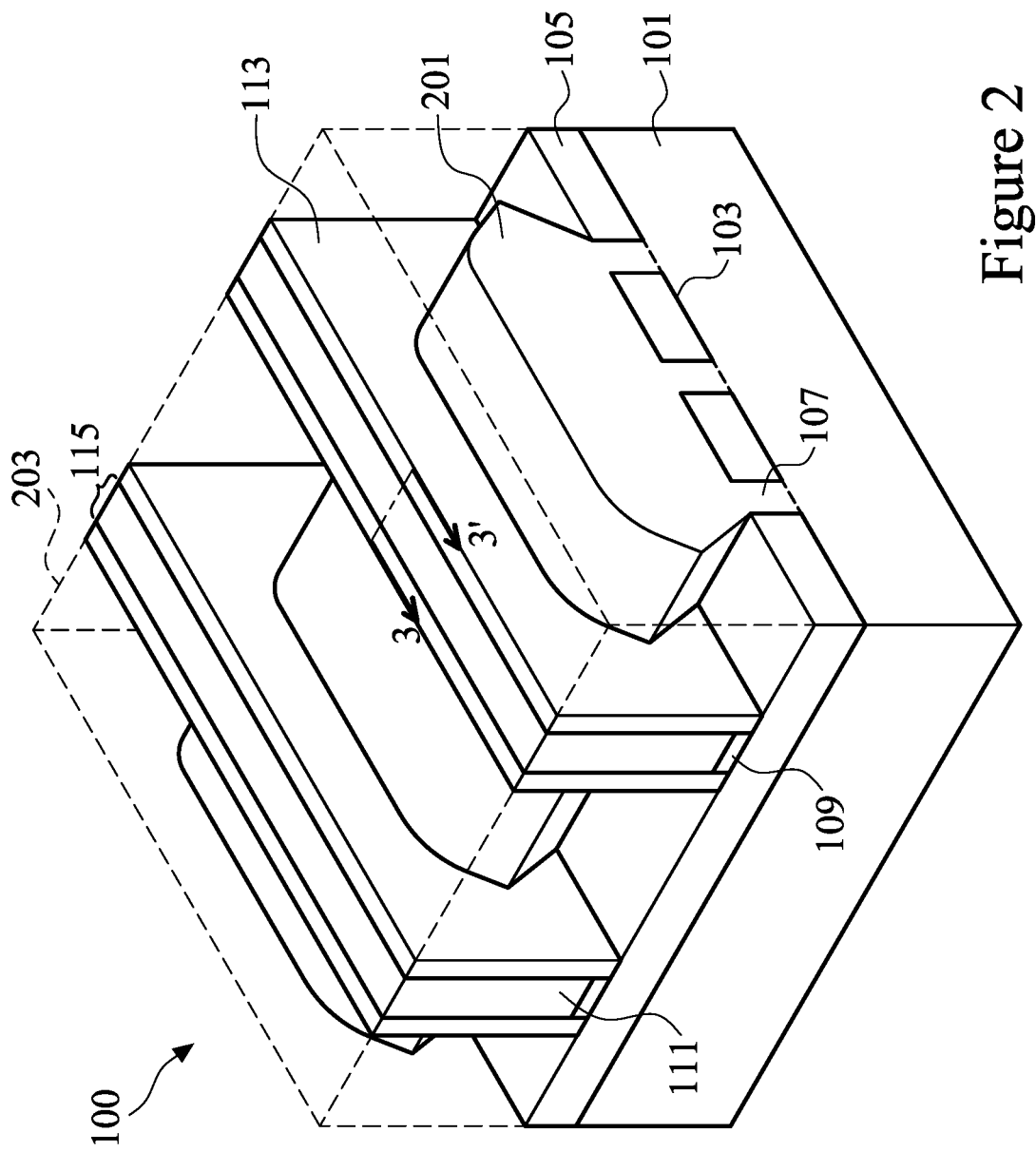
FIG. 2 illustrates formation of source/drain regions, in accordance with some embodiments.

FIG. 2 illustrates a removal of the fins 107 from those areas not protected by the stacks 115 and the first spacers 113 and a regrowth of source/drain regions 201. The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å and a height over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 203 (illustrated in dashed lines in FIG. 2 in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

Figure 3:
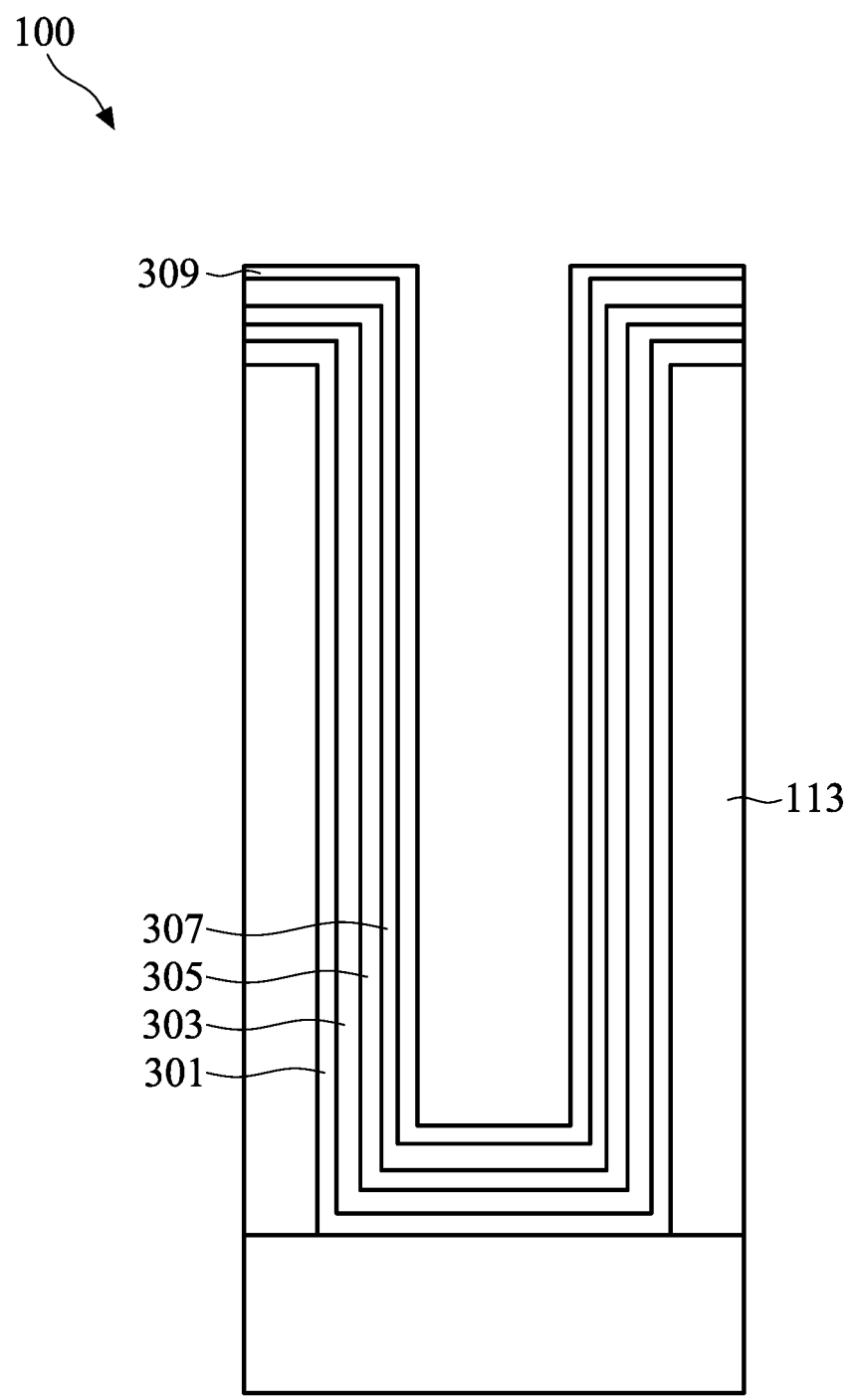
FIG. 3 illustrates formation of materials for a gate stack, in accordance with some embodiments.

FIG. 3 illustrates a cross-sectional view of FIG. 2 along line 3-3' in order to better illustrate a removal and replacement of the material of the dummy gate electrode 111 and the dummy gate dielectric 109. In an embodiment the dummy gate electrode 111 and the dummy gate dielectric 109 may be removed using, e.g., one or more wet or dry etching processes that utilize etchants that are selective to the materials of the dummy gate electrode 111 and the dummy gate dielectric 109. However, any suitable removal process or processes may be utilized.

Once the dummy gate electrode 111 and the dummy gate dielectric 109 have been removed, a process to form a first gate stack 603, may be begun by depositing a series of layers. In an embodiment the series of layers may include an interfacial layer 301, a first dielectric material 303, a first metal material 305, and a first p-metal work function layer 307.

Optionally, the interfacial layer 301 may be formed prior to the formation of the first dielectric material 303. In an embodiment the interfacial layer 301 may be a material such as silicon dioxide formed through a process such as in situ steam generation (ISSG) or a deposition process such as chemical vapor deposition or atomic layer deposition. In another embodiment the interfacial layer 301 may be a high-k material such as $HfO_2$, HfSiO, HfSiON, HfTaO, HfTiO, HfZrO, LaO, ZrO, $Ta_2O_5$, combinations of these, or the like, to a first thickness of between about 5 Å and about 20 Å, such as about 10 Å. In embodiments which utilize a deposition process, the interfacial layer 301 may be formed conformably as illustrated, while in embodiments in which ISSG is utilized the interfacial layer 301 may be formed along the bottom of the opening without extending along the sidewalls of the first spacers 113.

Once the interfacial layer 301 is formed, the first dielectric material 303 may be formed as a capping layer over the interfacial layer 301. In an embodiment the first dielectric material 303 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 303 may be deposited to a second thickness of between about 5 Å and about 200 Å, although any suitable material and thickness may be utilized.

Optionally, the first metal material 305 or metal gate capping layer may be formed adjacent to the first dielectric material 303 as a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 305 may be deposited using a deposition process such as atomic layer deposition, chemical vapor deposition, sputtering, or the like, to a third thickness of between about 5 Å and about 200 Å, although any suitable deposition process or thickness may be used.

The first p-metal work function layer 307 may be formed adjacent to the first metal material 305 and, in a particular embodiment, may be similar to the first metal material 305. For example, the first p-metal work function layer 307 may be formed from a metallic material such as TiN, Ti, TiAlN, TaC, TaCN, TaSiN, $TaSi_2$, $NiSi_2$, Mn, Zr, $ZrSi_2$, TaN, Ru, Al, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first p-metal work function layer 307 may be deposited using a deposition process such as atomic layer deposition, chemical vapor deposition, sputtering, or the like, to a fourth thickness of between about 5 Å and about 200 Å, although any suitable deposition process or thickness may be used.

FIG. 3 also illustrates a deposition of a first n-metal work function layer 309. In an embodiment, the first n-metal work function layer 309 may be a material such as TiAlC, TiAlN, Ti, Ag, Al, TaAl, TaAlC, TaC, TaCN, TaSiN, Mn, Zr, other suitable n-type work function materials, or combinations thereof. For example, the first n-metal work function layer 309 may be deposited utilizing an atomic layer deposition (ALD) process, CVD process, or the like, to a sixth thickness of between about 20 Å and about 50 Å, such as about 30 Å. However, any suitable materials and processes may be utilized to form the first n-metal work function layer 309.

However, after the deposition of the first n-metal work function layer 309, the material of the first n-metal work function layer 309 (e.g., TiAlC) is not as high of a quality as may be desired. In particular, the first n-metal work function layer 309 will have a high number of dangling bonds and defects. If left alone as the first n-metal work function layer 309 is deposited, the dangling bonds and defects will lead to undesirable diffusion of some of the elements (e.g., aluminum) away from the first n-metal work function layer 309, which can lead to a worsening of the device's interfacial defects ($D_{it}$) located between the interfacial layer 301 and the underlying channel within the fin 107. Such worsening can lead to a reduction in the overall performance of the device.

Figure 4:
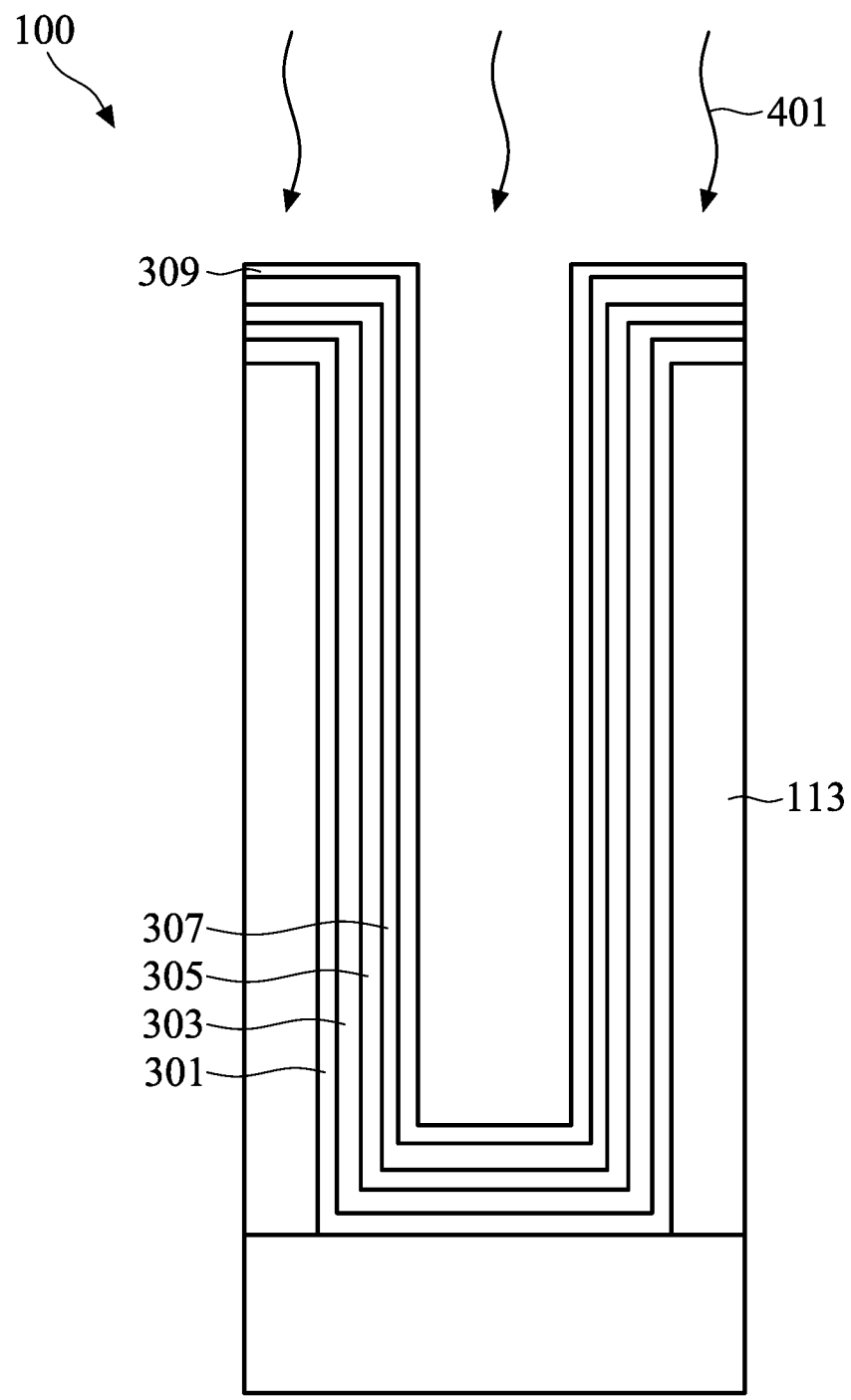
FIG. 4 illustrates a passivation process in accordance with some embodiments.

FIG. 4 illustrates a passivation process (represented in FIG. 4 by the arrows labeled 401) or treatment process which is performed in order to help passivate the dangling bonds that are present and also to help trap elements which may otherwise diffuse without increasing the overall thickness of the structure. In an embodiment the passivation process 401 may be performed in-situ with the deposition process and utilizing one or more suitable passivating elements, such as fluorine or the like.

In particular embodiments in which fluorine is utilized, the fluorine may be introduced to the first n-metal work function layer 309 utilizing a gaseous precursor which contains fluorine atoms. For example, in some embodiments the fluorine may be introduced to the first n-metal work function layer 309 by introducing a passivation precursor such as a fluorine containing precursor, such as tungsten fluoride ($WF_x$), nitrogen fluoride ($NF_x$), titanium fluoride ($TiF_x$), tantalum fluoride ($TaF_x$), hafnium fluoride ($HfF_x$), combinations of these, or the like, wherein the x may be between 1 and 6. However, any suitable passivation precursor based on the desired passivating element may be utilized.

In an embodiment the passivation process 401 may be initiated by introducing the passivation precursor to the first n-metal work function layer 309 within a passivation chamber. Such an introduction may be performed by using a carrier gas such as argon to carry the passivation precursor into the passivation chamber. The combined passivation precursor and carrier gas may be introduced into the passivation chamber at a flow rate of between about 100 sccm and about 6,000 sccm.

Within the passivation chamber, the passivation precursor may be contacted with the first n-metal work function layer 309 in order to initiate a chemical reaction within the first n-metal work function layer 309. In some embodiments the chemical reaction can be performed within the passivation chamber at a temperature between about 25° C. and about 500° C., such as about 300° C. and at a pressure of between about 0.5 torr and about 50 torr. However, any suitable parameters may be utilized.

In embodiments which utilize a fluorine precursor as the passivation precursor, by utilizing the passivation process 401, the fluorine that is present within the fluorine precursor (e.g., $WF_6$) will react with aluminum within the first n-metal work function layer 309. Such a reaction will create fluorine by-products such as aluminum fluoride.

In some embodiments, the passivation process 401 can be performed to incorporate the fluorine into the first n-metal work function layer 309. As such, the passivation process 401 may be performed for a time of between about 1 second and about 1 hour, such as between about 30 seconds and about 60 seconds. For these time periods, the passivation process 401 may cause the first n-metal work function layer 309 to have a concentration of fluorine of between about 1%-atomic and about 30%-atomic. However, any suitable concentrations of fluorine and any suitable time periods may be utilized.

Additionally, in some embodiments the other elements that are present within the fluorine precursor may be at least partially incorporated within the top surface of the first n-metal work function layer 309. For example, in an embodiment in which tungsten fluoride ($WF_6$) is utilized as the fluorine precursor, at least a portion of the tungsten within the tungsten fluoride will be incorporated into the top surface of the first n-metal work function layer 309 (after the fluorine has reacted with the aluminum). In some embodiments the tungsten may have a concentration along the top surface of the first n-metal work function layer 309 that is less than 10%-weight, such as being between about 2%-weight and about 3%-weight. However, any suitable concentration may be utilized.

By utilizing the passivation process 401, the passivating element (e.g., fluorine) that is present within the passivation precursor will diffuse and react into the structure. As such, a concentration gradient will exist within each of the first p-metal work function layer 307, the first metal material 305, the first dielectric material 303, and the interfacial layer 301 so that the $D_{it}$ can be improved.

By introducing the passivating element (e.g., fluorine) into the structure, the dangling bonds and defects that would otherwise be present will be diminished by the introduction of the passivating elements (e.g., fluorine). Additionally, this diminishment can be achieved without causing an increase in the thickness of the first n-metal work function layer 309. In particular, the passivating elements will react with the dangling bonds, thereby passivating the dangling bonds and repairing the defects. As such, the number of dangling bonds and number of defects will be reduced through the passivation process 401, while the first n-metal work function layer 309 remains at the sixth thickness.

Additionally, in embodiments in which the first n-metal work function layer 309 comprises a material which may have one or more elements which can undesirable diffuse, such as the aluminum within the material TiAlC, the passivation process 401 has the additional benefit of helping to reduce or eliminate diffusion of the element. For example, the passivating element (e.g., fluorine) will react with at least some of the aluminum that is present within the first n-metal work function layer 309. By bonding the fluorine with the aluminum that is present within the first n-metal work function layer 309 to form aluminum fluoride, the aluminum is at least partially trapped and is not able to diffuse as much into other areas of the structure. As such, while there may still be a concentration gradient in each underlying layer, the concentration gradient may be reduced or, in some embodiments, eliminated.

In a particular embodiment, by trapping the aluminum with fluorine, the aluminum bonded to the passivating element is not able to diffuse into the underlying structures, such as the first p-metal work function layer 307, the first metal material 305, the first dielectric material 303, and the interfacial layer 301. By reducing the amount of aluminum that is capable of diffusing, the overall amount of aluminum that will diffuse into these underlying layers can be reduced as well. In some embodiments the aluminum can be completely prevented from diffusing into the first dielectric material 303 and the interfacial layer 301.

Figure 5:
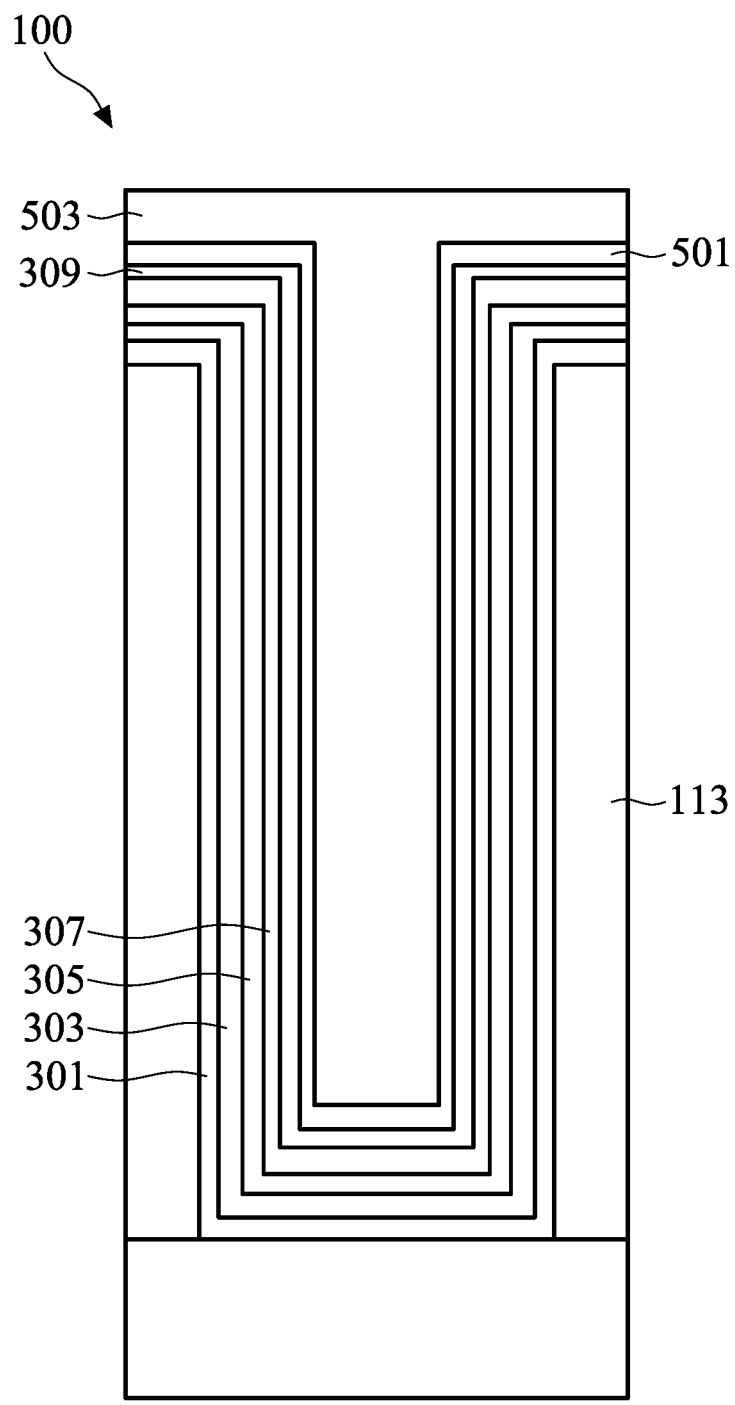
FIG. 5 illustrates a deposition of a fill material, in accordance with some embodiments.

FIG. 5 illustrates deposition of a glue layer 501 and a fill material 503. Once the first n-metal work function layer 309 has been formed, the glue layer 501 may be formed in order to help adhere the overlying fill material 503 with the underlying first n-metal work function layer 309 as well as provide a nucleation layer for the formation of the fill material 503. In an embodiment the glue layer 501 may be a material such as titanium nitride or else may be a material similar to the first n-metal work function layer 309 and may be formed using a similar process such as ALD to a seventh thickness of between about 10 Å and about 100 Å, such as about 50 Å. However, any suitable materials and processes may be utilized.

Once the glue layer 501 has been formed, the fill material 503 is deposited to fill a remainder of the opening using the glue layer 501. In an embodiment the fill material 503 may be a material such as Al, Cu, AlCu, W, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. Additionally, the fill material 503 may be deposited to a thickness of between about 1000 Å and about 2000 Å, such as about 1500 Å. However, any suitable material may be utilized.

Figure 6:
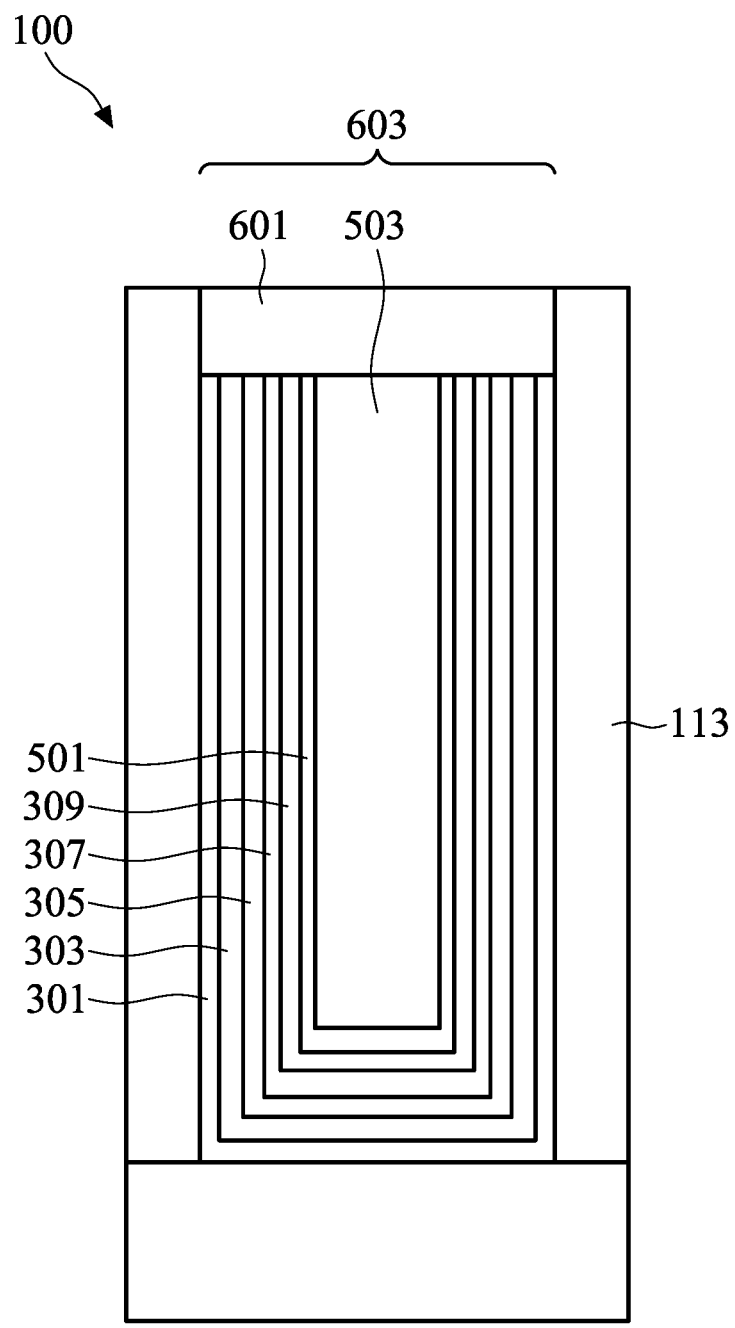
FIG. 6 illustrates a formation of a cap, in accordance with some embodiments.

FIG. 6 illustrates that, after the fill material 503 has been deposited to fill and overfill the opening, the materials may be planarized to form the first gate stack 603. In an embodiment the materials may be planarized with the first spacers 113 using, e.g., a chemical mechanical polishing process, although any suitable process, such as grinding or etching, may be utilized.

After the materials of the first gate stack 603 have been formed and planarized, the materials of the first gate stack 603 may be recessed and capped with a capping layer 601. In an embodiment the materials of the first gate stack 603 may be recessed using, e.g., wet or dry etching processes that utilize etchants selective to the materials of the first gate stack 603. In an embodiment the materials of the first gate stack 603 may be recessed a distance of between about 5 nm and about 150 nm, such as about 120 nm. However, any suitable process and distance may be utilized.

Once the materials of the first gate stack 603 have been recessed, the capping layer 601 may be deposited and planarized with the first spacers 113. In an embodiment the capping layer 601 is a material such as SiN, SiON, SiCON, SiC, SiOC, combinations of these, or the like, deposited using a deposition process such as atomic layer deposition, chemical vapor deposition, sputtering, or the like. The capping layer 601 may be deposited to a thickness of between about 5 Å and about 200 Å, and then planarized using a planarization process such as chemical mechanical polishing such that the capping layer 601 is planar with the first spacers 113.

By utilizing the embodiments described herein, diffusion of aluminum from the first n-metal work function layer 309 may be reduced or eliminated. As such, less aluminum diffuses to the various layers and, in particular, the amount of aluminum that diffuses to the first dielectric material 303 and the interfacial layer 301 and negative impact the interfacial and charge defects ($D_{it}$) of the first dielectric material 303 and the interfacial layer 301 may be minimized. Such a reduction in charge defects, in addition to helping in general, becomes especially helpful when materials such as silicon germanium, which may be more preferred but which have higher interface and charge defects, are utilized as the material for the channel within the fin 107.

Additionally, the benefits of reducing the impact of diffusion may be achieved without a reduction in subsequent process windows. In particular, by utilizing the passivation process 401 as described herein, no additional layers are needed before or after the deposition of the first n-metal work function layer 309, and the passivation process 401 will add no additional thickness to the first n-metal work function layer 309. As such, the gap fill windows for subsequent processing, such as the deposition of the fill material 503, can be kept broad while still obtaining the desired benefits.

In an embodiment a method of manufacturing a semiconductor device, the method includes: depositing a gate dielectric over a semiconductor fin; depositing a first p-metal work function layer over the gate dielectric; depositing a first n-metal work function layer over the first p-metal work function layer; and exposing the first n-metal work function layer to a fluorine containing gas. In an embodiment the fluorine containing gas is tungsten fluoride. In an embodiment the depositing the first n-metal work function layer deposits titanium aluminum carbide. In an embodiment the tungsten fluoride reacts with aluminum within the titanium aluminum carbide. In an embodiment the exposing increases a tungsten concentration within a top surface of the first n-metal work function layer. In an embodiment the method further includes depositing a glue layer over the first n-metal work function layer after the exposing the first n-metal work function layer. In an embodiment the first n-metal work function layer has a first thickness prior to the exposing the first n-metal work function layer and has the first thickness after the exposing the first n-metal work function layer.

In another embodiment, a method of manufacturing a semiconductor device, the method includes: depositing a first n-metal work function layer over and in physical contact with a first p-metal work function layer and a gate dielectric over a semiconductor fin; and trapping a first element within the first n-metal work function layer, the trapping being performed at least in part by exposing the first n-metal work function layer to a passivating precursor. In an embodiment the passivating precursor is a fluorine containing gas. In an embodiment the fluorine containing gas is tungsten fluoride. In an embodiment the fluorine containing gas is nitrogen fluoride. In an embodiment the fluorine containing gas is tungsten hafnium fluoride. In an embodiment the fluorine containing gas is tantalum fluoride. In an embodiment the exposing the first n-metal work function layer is performed at a temperature of between 25° C. and 500° C. and for a time of between thirty seconds and sixty seconds.

In yet another embodiment, a semiconductor device includes: a semiconductor fin; a gate dielectric over the semiconductor fin; a first p-metal work function layer over the gate dielectric; a first n-metal work function layer over and in physical contact with the first p-metal work function layer, the first n-metal work function layer comprising a region with a non-zero tungsten concentration; and aluminum located within both the first p-metal work function layer and the first n-metal work function layer, wherein a concentration gradient of the aluminum extends from the first n-metal work function layer and the first p-metal work function layer but ends before extending into the gate dielectric. In an embodiment the first n-metal work function layer comprises titanium aluminum carbide. In an embodiment the first p-metal work function layer comprises titanium nitride. In an embodiment a fluorine concentration within the first n-metal work function layer is between about 1%-atomic and about 30%-atomic. In an embodiment the non-zero tungsten concentration is between about 2%-weight and about 3%-weight. In an embodiment the semiconductor device further includes a glue layer over the first n-metal work function layer; a fill material over the glue layer; and a dielectric capping layer over the fill material The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   depositing a gate dielectric over a semiconductor fin;
   depositing a first p-metal work function layer over the gate dielectric;
   depositing a first n-metal work function layer over the first p-metal work function layer; and
   exposing the first n-metal work function layer to a fluorine containing gas, wherein the exposing the first n-metal work function layer prevents aluminum present within the first n-metal work function layer from diffusing into the gate dielectric, wherein after the exposing the first n-metal work function layer to the fluorine containing gas, the first n-metal work function layer comprises a region with a non-zero tungsten concentration, wherein aluminum is located within both the first p-metal work function layer and the first n-metal work function layer, and wherein a concentration gradient of the aluminum extends from the first n-metal work function layer and the first p-metal work function layer but ends before extending into the gate dielectric.

2. The method of claim 1, wherein the fluorine containing gas is tungsten fluoride.

3. The method of claim 2, wherein the depositing the first n-metal work function layer deposits titanium aluminum carbide.

4. The method of claim 3, wherein the tungsten fluoride reacts with aluminum within the titanium aluminum carbide.

5. The method of claim 4, wherein the exposing increases a tungsten concentration within a top surface of the first n-metal work function layer.

6. The method of claim 1, further comprising depositing a glue layer over the first n-metal work function layer after the exposing the first n-metal work function layer.

7. The method of claim 1, wherein the first n-metal work function layer has a first thickness prior to the exposing the first n-metal work function layer and has the first thickness after the exposing the first n-metal work function layer.

8. A method of manufacturing a semiconductor device, the method comprising:
   depositing a first n-metal work function layer over and in physical contact with a first p-metal work function layer and a gate dielectric over a semiconductor fin; and
   trapping a first element within the first n-metal work function layer, the trapping being performed at least in part by exposing the first n-metal work function layer to a passivating precursor, the first element being aluminum, wherein after the trapping the first element the first n-metal work function layer comprises a region with a non-zero tungsten concentration, wherein the first element is located within both the first p-metal work function layer and the first n-metal work function layer, and wherein a concentration gradient of the aluminum extends from the first n-metal work function layer and the first p-metal work function layer but ends before extending into the gate dielectric.

9. The method of claim 8, wherein the passivating precursor is a fluorine containing gas.

10. The method of claim 9, wherein the fluorine containing gas is tungsten fluoride.

11. The method of claim 9, wherein the fluorine containing gas is nitrogen fluoride.

12. The method of claim 9, wherein the fluorine containing gas is tungsten hafnium fluoride.

13. The method of claim 9, wherein the fluorine containing gas is tantalum fluoride.

14. The method of claim 9, wherein the exposing the first n-metal work function layer is performed at a temperature of between 25° C. and 500° C. and for a time of between thirty seconds and sixty seconds.

15. A method of manufacturing a semiconductor device, the method comprising:
forming a semiconductor fin;
forming a gate dielectric over the semiconductor fin;
forming a first p-metal work function layer over the gate dielectric; and
forming a first n-metal work function layer over and in physical contact with the first p-metal work function layer, the first n-metal work function layer comprising a region with a non-zero tungsten concentration, wherein aluminum is located within both the first p-metal work function layer and the first n-metal work function layer, and wherein a concentration gradient of the aluminum extends from the first n-metal work function layer and the first p-metal work function layer but ends before extending into the gate dielectric.

16. The method of claim 15, wherein the first n-metal work function layer comprises titanium aluminum carbide.

17. The method of claim 15, wherein the first p-metal work function layer comprises titanium nitride.

18. The method of claim 15, wherein a fluorine concentration within the first n-metal work function layer is between about 1%-atomic and about 30%-atomic.

19. The method of claim 15, wherein the non-zero tungsten concentration is between about 2%-weight and about 3%-weight.

20. The method of claim 15, further comprising:
forming a glue layer over the first n-metal work function layer;
forming a fill material over the glue layer; and
forming a dielectric capping layer over the fill material.

* * * * *